(12) United States Patent
Kim et al.

(10) Patent No.: US 7,791,396 B2
(45) Date of Patent: Sep. 7, 2010

(54) SEMICONDUCTOR INTEGRATED CIRCUIT AND SEMICONDUCTOR PACKAGE MODULE HAVING THE SAME

(75) Inventors: Young-Ju Kim, Gyeonggi-do (KR); Kwan-Weon Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 675 days.

(21) Appl. No.: 11/822,268

(22) Filed: Jul. 3, 2007

(65) Prior Publication Data

US 2008/0225497 A1  Sep. 18, 2008

(30) Foreign Application Priority Data

Mar. 12, 2007  (KR) .................. 10-2007-0024082

(51) Int. Cl.
*H03L 5/00* (2006.01)

(52) U.S. Cl. ............... 327/309; 327/306; 327/327; 327/328; 327/534; 327/537; 257/672; 257/676; 257/773

(58) Field of Classification Search .......... 327/306, 327/309, 327, 328, 534, 537; 257/672, 676, 257/773
See application file for complete search history.

(56) References Cited

U.S. PATENT DOCUMENTS

| | | | | |
|---|---|---|---|---|
| 5,512,783 A | * | 4/1996 | Wakefield et al. | 257/693 |
| 5,546,016 A | * | 8/1996 | Allen | 326/30 |
| 5,770,964 A | * | 6/1998 | Suma | 327/328 |
| 6,157,224 A | * | 12/2000 | Linder | 327/108 |
| 6,257,491 B1 | * | 7/2001 | Tan et al. | 235/462.36 |
| 6,329,863 B1 | | 12/2001 | Lee et al. | |
| 6,417,718 B1 | * | 7/2002 | Ota | 327/407 |
| 6,442,056 B2 | * | 8/2002 | Nuxoll et al. | 365/52 |
| 6,653,727 B2 | * | 11/2003 | Hwang et al. | 257/693 |
| 6,815,807 B2 | * | 11/2004 | Corisis | 257/672 |
| 7,076,705 B2 | | 7/2006 | Ohbayashi | |
| 7,253,457 B2 | * | 8/2007 | Hirose | 257/203 |
| 7,644,250 B2 | * | 1/2010 | Zimmerman et al. | 711/170 |
| 2006/0023563 A1 | | 2/2006 | Yoo | |
| 2006/0036992 A1 | | 2/2006 | Hayles et al. | |
| 2006/0180913 A1 | | 8/2006 | Lee et al. | |

FOREIGN PATENT DOCUMENTS

| | | |
|---|---|---|
| KR | 10-1993-0001406 | 1/1993 |
| KR | 10-1998-0028356 | 7/1998 |
| KR | 102003004671 | 6/2003 |
| WO | WO-00/11486 | 3/2000 |

* cited by examiner

*Primary Examiner*—Linh V Nguyen
(74) *Attorney, Agent, or Firm*—Venable LLP; Jeffri A. Kaminski (57) ABSTRACT

A semiconductor integrated circuit includes a first clock pin controller that receives a mirror function signal and a test mode signal to generate a first input buffer control signal in response to the mirror function signal in a normal mode. A second clock pin controller receives the mirror function signal and the test mode signal to generate a second input buffer control signal, which is an inverted signal of the first input buffer control signal, in response to the mirror function signal in the normal mode. An input buffer unit generates output signals of first and second pins in response to the first input buffer control signal and the second input buffer control signal, respectively.

25 Claims, 5 Drawing Sheets

FIG. 1

|   | 1 | 2 | 3 | 4 | 5 | 6 | 7 | 8 | 9 | 10 | 11 | 12 |
|---|---|---|---|---|---|---|---|---|---|----|----|----|
| A | V | V | V | DQ | | | | | DQ | V | V | V |
| B | V | DQ | DQ | V | | | | | V | DQ | DQ | V |
| C | V | DQ | DQ | V | | | | | V | DQ | DQ | V |
| D | V | DQ | DQ | V | | | | | V | DQ | DQ | V |
| E | V | DQ | DQ | V | | | | | V | DQ | DQ | V |
| F | V | DQ | DQ | C | | | | | C | DQ | DQ | V |
| G | V | V | DQ | V | | | | | V | DQ | V | V |
| H | V | A | C1 | C | | | | | C | C2 | A | V |
| J | V | NC | C | V | | | | | V | C | NC | V |
| K | V | A | A | A | | | | | A | A | A | V |
| L | V | V | DQ | A | | | | | A | DQ | V | V |
| M | V | DQ | DQ | A | | | | | A | DQ | DQ | V |
| N | V | DQ | DQ | V | | | | | V | DQ | DQ | V |
| P | V | DQ | DQ | V | | | | | V | DQ | DQ | V |
| R | V | DQ | DQ | V | | | | | V | DQ | DQ | V |
| T | V | DQ | DQ | V | | | | | V | DQ | DQ | V |
| U | V | V | V | V | | | | | V | V | V | V |

FIG. 6

SEMICONDUCTOR INTEGRATED CIRCUIT AND SEMICONDUCTOR PACKAGE MODULE HAVING THE SAME

CROSS-REFERENCE TO RELATED APPLICATIONS

This application claims priority from Korean Patent Application No. 10-2007-0024082 filed on Mar. 12, 2007 in the Korean Intellectual Property Office, the disclosure of which is incorporated herein by reference in its entirety.

BACKGROUND OF THE INVENTION

1. Technical Field

The present invention relates to a semiconductor integrated circuit, and more particularly, to a semiconductor integrated circuit including a package in which pins are arranged in a mirror type fashion and to a semiconductor package module having the same.

2. Related Art

Semiconductor integrated circuits are manufactured by various semiconductor manufacturing techniques, such as a silicon wafer manufacturing technique and a logic design technique. The semiconductor integrated circuit is supplied with a driving voltage suitable for driving the semiconductor integrated circuit mounted on a printed circuit board (PCB). The semiconductor integrated circuit is operated by specific input and output signals. That is, the operation and operation mode of a semiconductor apparatus are determined by a combination of input signals.

In recent years, a plurality of semiconductor integrated circuits is integrated into a channel to form a module in order to improve the capacity and the degree of integration of semiconductor apparatuses. The memory module includes a plurality of packaged semiconductor integrated circuits mounted on a module substrate. The packaged semiconductor integrated circuits each have a plurality of connection terminals for electrical connection to connectors on the module substrate. In the semiconductor package module, the semiconductor integrated circuits may be arranged in a mirror type such that their sides are symmetric with respect to the substrate. That is, pins on one side and on the other side are symmetrically arranged, which makes it possible to minimize the lengths of wiring lines and thus reduce the area of a semiconductor package module.

In general, external signals may be input to the pins of the semiconductor integrated circuit through an input buffer unit. In the semiconductor integrated circuit forming the mirror-type semiconductor package module, a mirror function circuit should be activated to supply the same signal to the pins arranged symmetrically. However, in order to individually supply signals to the pins, the mirror function circuit is inactivated, so that the pins can be individually operated.

Meanwhile, in order to prepare for the activation of the mirror function circuit, input buffer units are connected to specific pins that are symmetrically arranged in the semiconductor integrated circuit. When the mirror function circuit is activated, the input buffer units are activated such that the same signal is supplied to the specific pins. However, when the mirror function circuit is inactivated, no signal may be supplied to the specific pins (which is called 'no connection' (NC)). However, since the specific pins are controlled by the same input buffer signals, the input buffer units connected to the NC pins are kept in an active state. Therefore, a standby current may be continuously consumed in the input buffer units connected to the NC pins to which no external signals are supplied.

SUMMARY OF THE INVENTION

Embodiments of the present invention provide a semiconductor integrated circuit and a semiconductor package module including the same that are capable of preventing an increase in current consumption.

According to an embodiment of the present invention, a semiconductor integrated circuit includes: a first clock pin controller that receives a mirror function signal and a test mode signal and supplies a first input buffer control signal in response to the mirror function signal in a normal mode; a second clock pin controller that receives the mirror function signal and the test mode signal and supplies a second input buffer control signal, which is an inverted signal of the first input buffer control signal, in response to the mirror function signal in the normal mode; and an input buffer unit that exclusively supplies output signals of first and second clock pins in response to the first input buffer control signal and the second input buffer control signal, respectively.

According to another embodiment of the present invention, a semiconductor integrated circuit includes: a first clock pin controller that receives a mirror function signal and a test mode signal and supplies an inactive first input buffer control signal in response to an active mirror function signal in a normal mode; a second clock pin controller that receives the mirror function signal and the test mode signal and supplies an active second input buffer control signal, which is an inverted signal of the first input buffer control signal, in response to the active mirror function signal in the normal mode; and an input buffer unit that receives the first input buffer control signal and the second input buffer control signal and exclusively supplies output signals of first and second pins in the normal mode.

According to still another embodiment of the invention, a semiconductor package module includes the semiconductor integrated circuits arranged in a mirror type.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION OF EXEMPLARY EMBODIMENT

The attached drawings for illustrating preferred embodiments of the present invention are referred to in order to gain a sufficient understanding of the present invention, the merits thereof, and the objectives accomplished by the implementation of the present invention.

Hereinafter, the present invention will be described in detail by explaining preferred embodiments of the invention with reference to the attached drawings. Like reference numerals in the drawings denote like elements.

Embodiments of the present invention will now be described in detail with reference to the accompanying drawings.

According to an embodiment of the invention, it is possible to exclusively control input buffer units for predetermined pins symmetrically arranged in a mirror-type package in response to signals from a mirror function circuit. In particular, it is possible to control input buffer units not to be operated when the mirror function circuit is inactivated so that signals are not supplied to some of a predetermined number of pins that are connected to each other in a symmetric structure. That is, it is possible to exclusively control the input buffer units by using the signals output from the mirror function circuit such that signals are not simultaneously supplied to the symmetrically arranged pins.

A semiconductor package module having a semiconductor integrated circuit provided therein will be described below in more detail.

Figure 1:
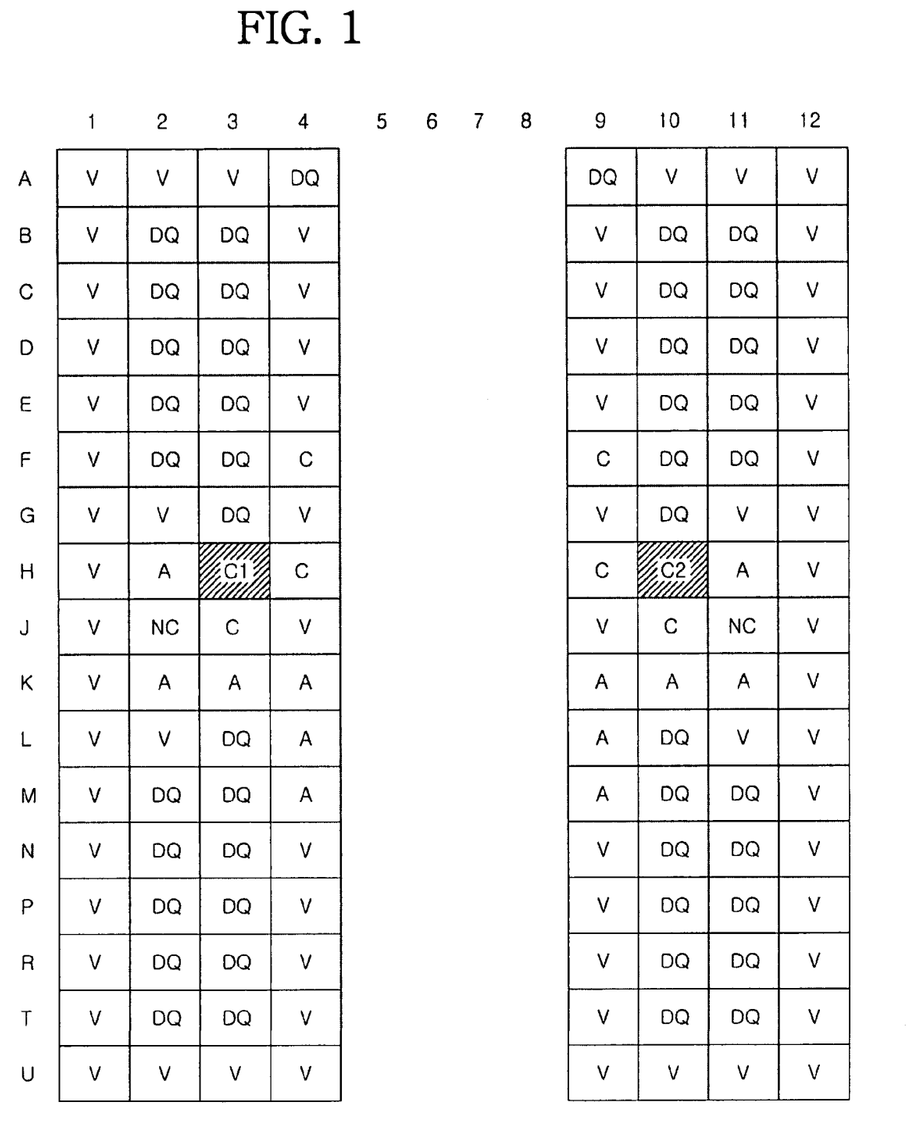
FIG. 1 is a diagram illustrating the arrangement of pins in a mirror-type package module according to an embodiment of the present invention.

Referring to FIG. 1, in a mirror-type package module according to an embodiment of the present invention, pins are symmetrically arranged with respect to fifth to eighth columns.

More specifically, for example, power pins V, input/output pins DQ, address pins A, and clock pins C are symmetrically arranged with respect to the fifth to eighth columns. The symmetric arrangement makes it possible to reduce the length of wiring lines connecting the pins and thus reduce the area of the module. For convenience of explanation, the power pins V, the input/output pins DQ, the address pins A and the clock pins C are symmetrically arranged, but the types of pins are not limited thereto. For example, various types of pins may be provided according to the configuration of various semiconductor integrated circuits.

When the mirror function circuit is activated, the same signal may be supplied to the pins that are arranged symmetrically. However, when the mirror function circuit is inactivated, signals may be individually supplied to the pins that are arranged symmetrically to individually operate the pins. When the individual signals are supplied to the pins, input buffer units connected to the pins are activated in the semiconductor integrated circuit. In general, the input buffer units connected to the pins are controlled by input buffer signals. That is, it is possible to control the input buffer units connected to the pins by using the input buffer to signals according to whether an external signal is supplied.

Meanwhile, in first and second clock pins C1 and C2 that are symmetrically arranged in FIG. 1, when the mirror function circuit is activated, an input buffer unit for the second clock pin C2 is activated such that the same signal is supplied to the first and second clock pins C1 and C2. However, when the mirror function circuit is inactivated, no signal is supplied to the second clock pin C2, and only the input buffer unit for the first clock pin C1 is activated. In this embodiment, for convenience of explanation, clock pins are shown as an example, but the above-mentioned structure may be applied to other pins under the same conditions as described above.

In particular, generally, when an input buffer signal is supplied to the input buffer unit for the second clock pin C2 even though no signal should be supplied to the second clock pin C2, the input buffer unit is activated. In this case, the input buffer unit for the second clock pin C2 may continuously consume a standby current even when no signal should be supplied. In addition, when the mirror function circuit is activated, the first clock pin C1 is in a floating state, but a predetermined amount of current may still be consumed.

However, according to an embodiment of the invention, when two pins among the pins that are symmetrically arranged should serve as NC pins in a period when the mirror function circuit is inactivated, it is possible to exclusively control the input buffer units for the two pins. More specifically, in a semiconductor integrated circuit according to an embodiment of the invention, when pins should serve as NC pins according to whether the mirror function circuit is operated, it is possible to control the input buffer unit by generating a new input buffer control signal that includes information on a signal related to the mirror function circuit and a test mode signal.

Figure 2:
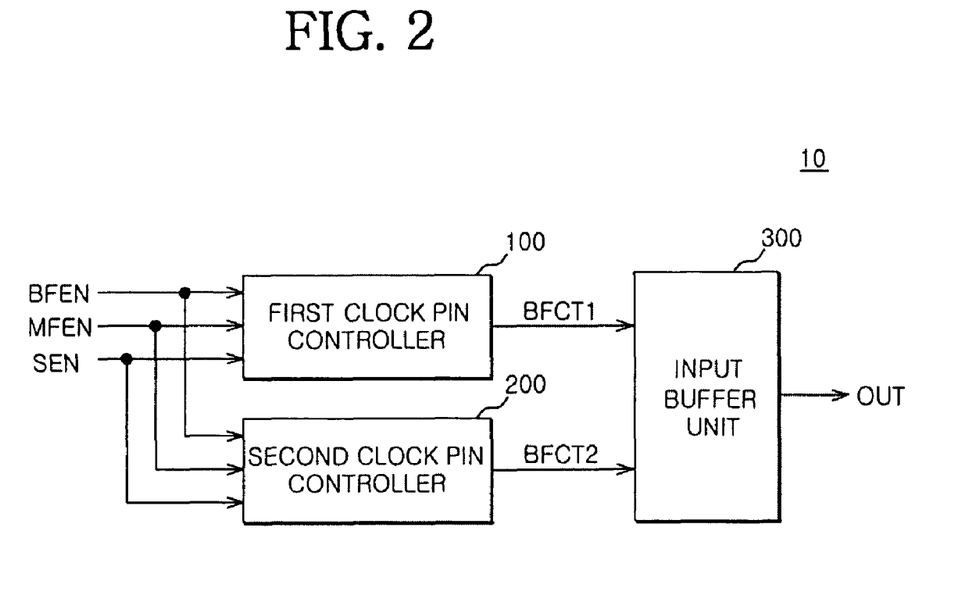
FIG. 2 is a block diagram schematically illustrating the structure of a semiconductor integrated circuit according to an embodiment of the present invention.

The above will be described in detail below with reference to FIG. 2.

The semiconductor integrated circuit 10 according to this embodiment of the present invention includes a first clock pin controller 100, a second clock pin controller 200, and an input buffer unit 300.

As described above, the first clock pin (see reference numeral C1 in FIG. 1) and the second clock pin (see reference numeral C2 in FIG. 1) are physically symmetric with respect to a vertical axis. When the mirror function circuit is activated, the same signal is supplied to the first and second clock pins C1 and C2. However, when the mirror function circuit is inactivated, no signal is supplied to the second clock pin C2.

The first clock pin controller 100 supplies a first input buffer control signal BFCT1 that is in an active state in a test mode. Meanwhile, in a normal mode, the first clock pin controller 100 supplies the first input buffer control signal BFCT1 to the input buffer unit 300 in response to a mirror function signal MFEN.

More specifically, the first clock pin controller 100 receives an input buffer signal BFEN, the mirror function signal MFEN, and a test mode signal SEN and supplies the first input buffer control signal BFCT1.

Next, the second clock pin controller 200 will be described below.

The second clock pin controller 200 supplies a second input buffer control signal BFCT2 that is in an active state during the test mode. Meanwhile, in the normal mode, the second clock pin controller 200 supplies the second input buffer control signal BFCT2 to the input buffer unit 300 in response to the mirror function signal MFEN, similar to the first clock pin controller 100. However, in the normal mode, the second clock pin controller 200 receives the input buffer signal BFEN, the mirror function signal MFEN, and the test mode signal SEN and responds to the mirror function signal MFEN, but supplies the second input buffer control signal BFCT2, which is an inverted signal of the first input buffer control signal BFCT1, to the input buffer unit 300.

In other words, in the test mode, the second clock pin controller 200 supplies the second input buffer control signal BFCT2 that is in an active state, similar to the first clock pin controller 100. However, in the normal mode, the second clock pin controller 200 responds to the mirror function signal MFEN independently of the first clock pin controller 100.

Therefore, in the normal mode, even when the first and second clock pin controllers 100 and 200 receive the same mirror function signal MFEN, the first and second clock pin controllers 100 and 200 are not simultaneously activated, but are selectively activated. That is, in the normal mode, the first and second clock pin controllers 100 and 200 are selectively controlled by the mirror function signal MFEN, which makes it possible to prevent an increase in current consumption.

The input buffer unit 300 may include input buffers connected to the first and second clock pins (see reference numerals C1 and C2 in FIG. 1).

The input buffer unit 300 receives the first or second input buffer control signal BFCT1 or BFCT2 and supplies an output signal OUT.

In this way, in the semiconductor integrated circuit 10 according to an embodiment of the invention, it is possible to exclusively control the input buffer units 300 connected to the first and second clock pins arranged symmetrically in response to the mirror function signal MFEN in the normal mode.

The above will be described in detail below with reference to FIG. 3.

Figure 3:
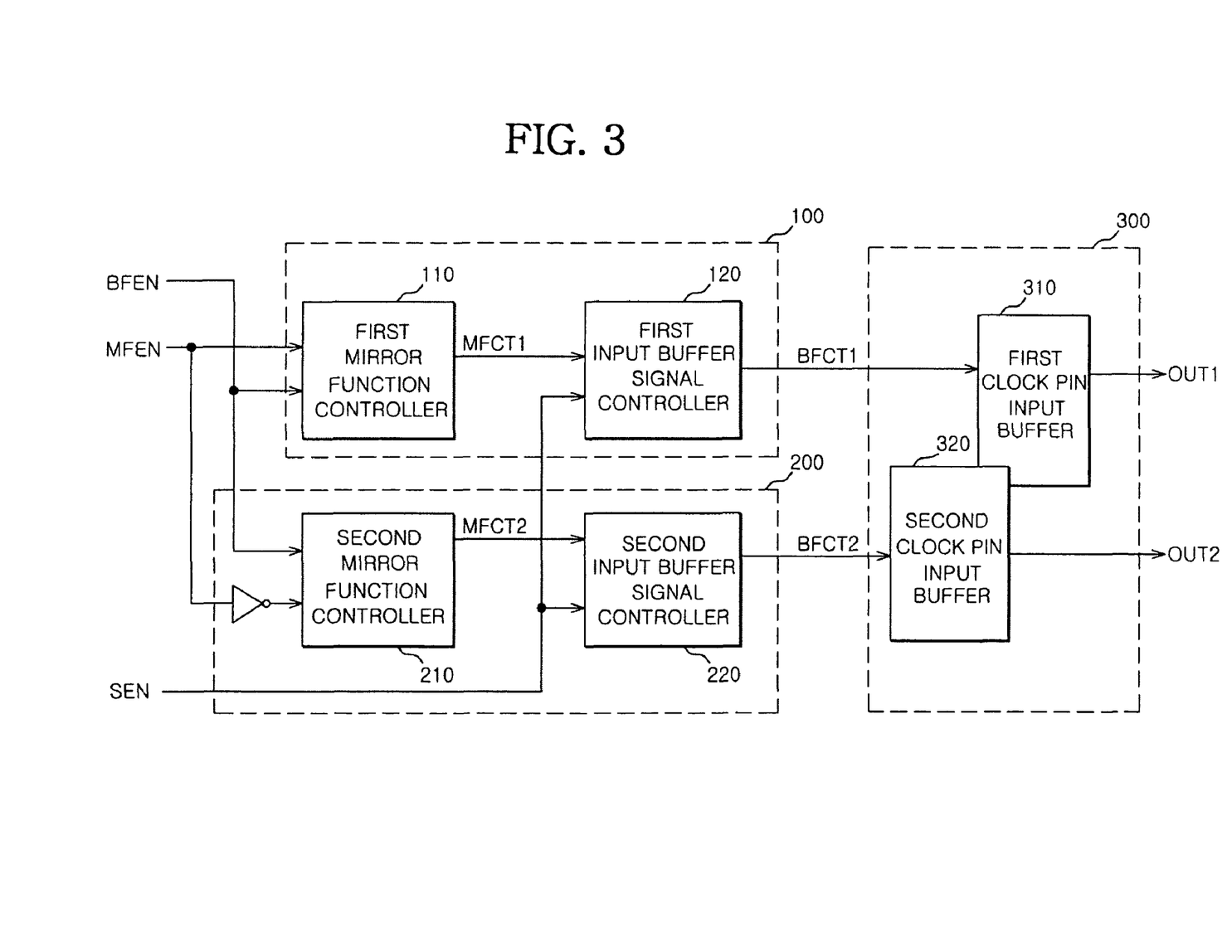
FIG. 3 is a detailed block diagram illustrating the semiconductor integrated circuit shown in FIG. 2.

Referring to FIG. 3, the first clock pin controller 100 includes a first mirror function controller 110 and a first input buffer signal controller 120. The second clock pin controller 200 includes a second mirror function controller 210 and a second input buffer signal controller 220. The input buffer 300 includes a first clock pin input buffer 310 and a second clock pin input buffer 320.

First, the first mirror function controller 110 of the first clock pin controller 100 supplies a first mirror function control signal MFCT1 in response to the mirror function signal MFEN.

More specifically, the first mirror function controller 110 receives the mirror function signal MFEN and the input buffer signal BFEN and supplies the first input buffer control signal BFCT1 to the first input buffer signal controller 120. That is, the first mirror function controller 110 receives the mirror function signal MFEN and the input buffer signal BFEN and responds to the mirror function signal MFEN to supply the first mirror function control signal MFCT1.

The first input buffer signal controller 120 receives the first mirror function control signal MFCT1 and the test mode signal SEN. When the test mode signal SEN is activated, for example, a scan mode test is performed to activate all cells. Since all of the pins should be activated in the scan test mode, the input buffer units 300 connected to all of the pins have to be activated. Therefore, when the test mode signal SEN is activated, the input buffer unit 300 can be controlled in response to the activated test mode signal SEN. When the test mode signal SEN is inactivated, the semiconductor integrated circuit is switched to the normal mode in which the first clock pin input buffer 310 can be controlled according to the level of the first mirror control signal MFCT1.

The configuration of the second clock pin controller 200 is similar to the first clock pin controller 100. Only the differences between the first and second clock pin controllers 100 and 200 will be described below.

The second clock pin controller 200 includes the second mirror function controller 210 and the second input buffer signal controller 220.

In the normal mode, the second mirror function controller 210 functions similar to the first mirror function controller 110 in that it responds to the mirror function signal MFEN. However, the second mirror function controller 210 differs from the first mirror function controller 110 in that it receives the input buffer signal BFEN and an inverted signal of the mirror function signal MFEN and supplies a second mirror function control signal MFCT2, which is an inverted signal of the first mirror function control signal MFCT1.

The first and second clock pin controllers 100 and 200 will be described in detail below with reference to FIGS. 4 and 5.

Figure 4:
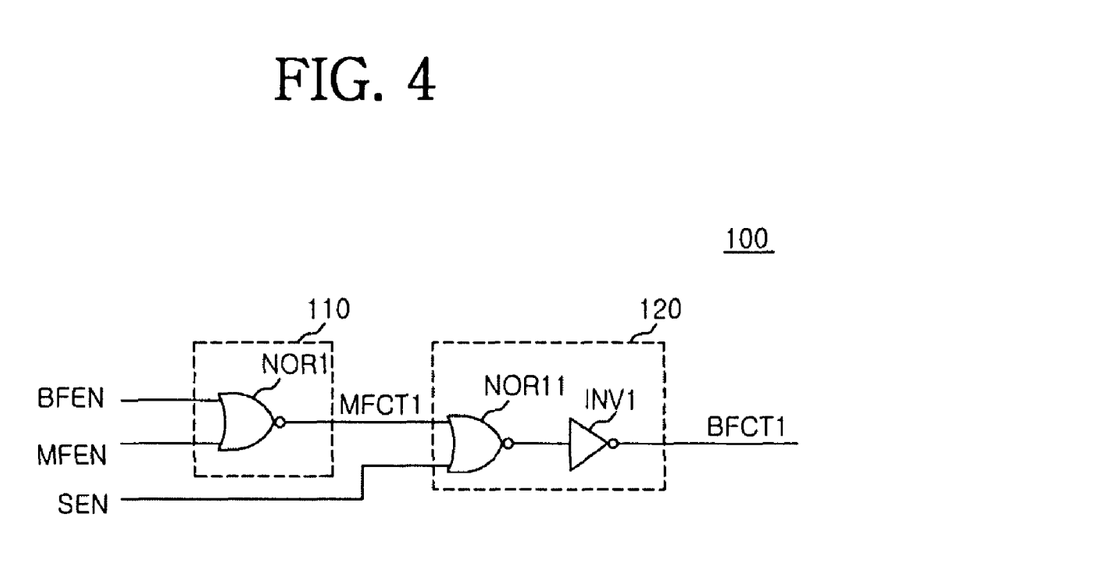
FIG. 4 is a circuit diagram illustrating the detailed structure of a first clock pin controller according to an embodiment of the present invention.

Referring to FIG. 4, the first mirror function controller 110 includes a NOR gate NOR1 that receives the input buffer signal BFEN and the mirror function signal MFEN. The first mirror function controller 110 supplies the first mirror function control signal MFCT1 according to a NOR gating operation of the NOR gate NOR1. The first input buffer signal controller 120 includes a NOR gate NOR11 that receives the first mirror function control signal MFCT1 and the test mode signal SEN and an inverter INV1.

Figure 5:
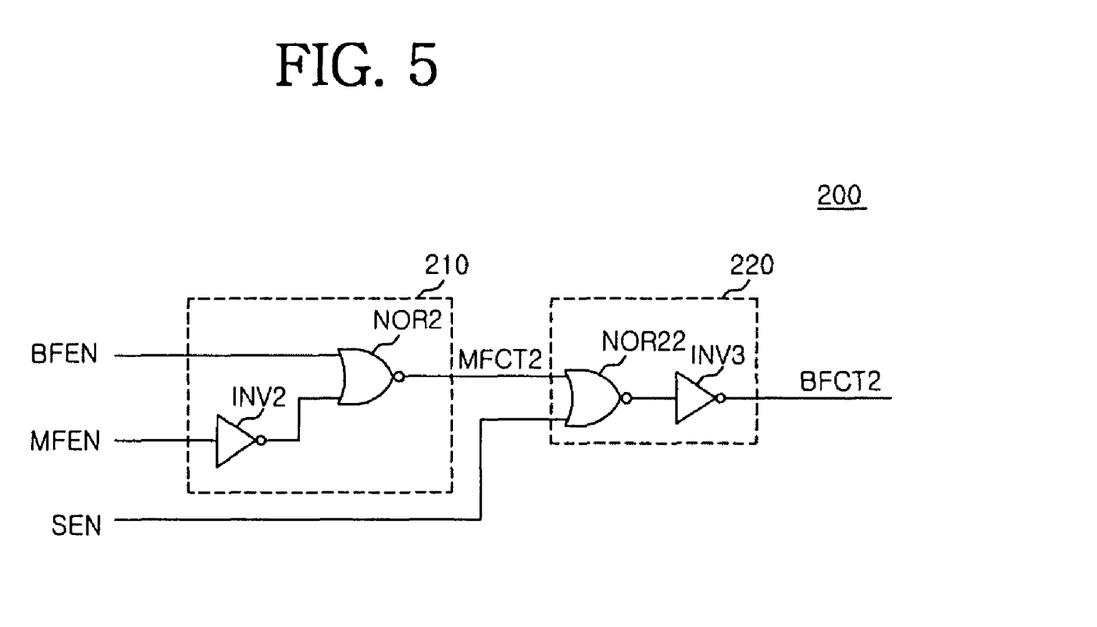
FIG. 5 is a circuit diagram illustrating the detailed structure of a second clock pin controller according to an embodiment of the present invention.

In FIG. 5, only the differences between the configurations shown in FIGS. 4 and 5 will be described below.

The second mirror function controller 210 of the second clock pin controller 200 differs from the first mirror function controller 110 in that a NOR gate NOR2 receives an inverted signal of the mirror function signal MFEN. In this way, the first and second mirror function controllers 110 and 210 can selectively supply the first and second mirror function control signals MFCT1 and MFCT2, respectively.

The operation of the first clock pin controller 100 will be described below with reference to FIG. 4.

When the test mode signal SEN is activated at a high level, the first clock pin controller 100 outputs a high-level first input buffer control signal BFCT1. When the test mode signal SEN becomes a high level, it is possible to supply a high-level first input buffer control signal BFCT1 regardless of the mirror function signal BFEN.

However, when the test mode signal SEN becomes a low level, the first clock pin controller 100 responds to the first mirror function control signal MFCT1. More specifically, the first mirror function controller 110 receives a low-level input buffer signal BFEN and a high-level mirror function signal MFEN. Then, the first mirror function control signal MFCT1 becomes a low level by a NOR gating operation of the NOR gate NOR1. In this case, as described above, the test mode signal SEN is a low-level signal. In this way, the first input buffer control signal BFCT1 at a low level is supplied by the NOR gating operation of the NOR gate NOR11 and the inverter INV1.

However, when the mirror function signal MFEN input to the first mirror function controller 110 is at a low level, that is, the mirror function circuit does not operate, the first mirror control signal MFCT1 becomes a high level by the NOR gating operation. The high-level first mirror control signal MFCT1 is input to the first input buffer signal controller 120. In this way, it is possible to supply a high-level first input buffer control signal BFCT1 by using the NOR gate NOR11 and the inverter INV1 of the first input buffer signal controller 120.

That is, when the test mode signal SEN is activated, a high-level first input buffer control signal BFCT1 is supplied to activate the first clock pin input buffer 310 connected to the first clock pin. However, when the test mode signal SEN is inactivated, the first clock pin controller 100 controls the first input buffer control signal BFCT1 in response to the mirror function signal MFEN. In other words, when the mirror function circuit is activated, the first clock pin controller 100 supplies an inactive first input buffer control signal BFCT1. In this way, when the mirror function circuit is activated, the input buffer 310 for the first clock pin C1 is reliably inactivated, which makes it possible to prevent an increase in current consumption. Meanwhile, when the mirror function circuit is inactivated, the first clock pin controller 100 supplies an active first input buffer control signal BFCT1. In this way, it is possible to activate the input buffer 310 for the first clock pin C1.

The operation of the second clock pin controller will be described with reference to FIG. 5 and a description of the same configuration as that in FIG. 4 will be omitted.

Similar to the first clock pin controller 100 shown in FIG. 4, in the second clock pin controller 200 shown in FIG. 5, when an active test mode signal SEN is supplied, the second clock pin input buffer 320 connected to the second clock pin C2 can be activated regardless of whether the mirror function circuit is activated.

When the test mode signal SEN is inactivated at a low level, that is, in the normal mode, the second clock pin controller 200 supplies the second mirror function control signal MFCT2 in response to the mirror function signal MFEN. However, unlike the first mirror function controller 110, using inverter INV2, an inverted signal of the active mirror function signal MFEN, that is, a low-level signal is input to the NOR gate NOR2. Since the input buffer signal BFEN is at a low level, the second mirror function controller 210 supplies a high-level second mirror function control signal MFCT2 by the NOR gating operation of the NOR gate NOR2. A high-level second input buffer control signal BFCT2 can be supplied by the inverter INV3 and the NOR gating operation of the NOR gate NOR22 that receives the high-level second mirror function control signal MFCT2 and the low-level test mode signal SEN.

That is, in the test mode, the second clock pin controller 200 supplies a high-level second input buffer control signal BFCT2 regardless of the mirror function signal MFEN to activate the input buffer 320 connected to the second clock pin (see reference numeral C2 in FIG. 1). However, in the normal mode, the second clock pin controller 200 is operated exclusively for the first mirror function controller 110 in response to the mirror function signal MFEN. In other words, it is possible to prevent the input buffers connected to the pins that are symmetrically arranged from being simultaneously activated when the mirror function circuit is activated or inactivated, thereby reducing current consumption. Therefore, when the mirror function circuit is activated or inactivated, it is possible to prevent an increase in current consumption by exclusively controlling the input buffers corresponding to the pins that are symmetrically arranged.

A method of controlling the input buffers by using the first and second input buffer control signals BFCT1 and BFCT2 will be described below.

Figure 6:
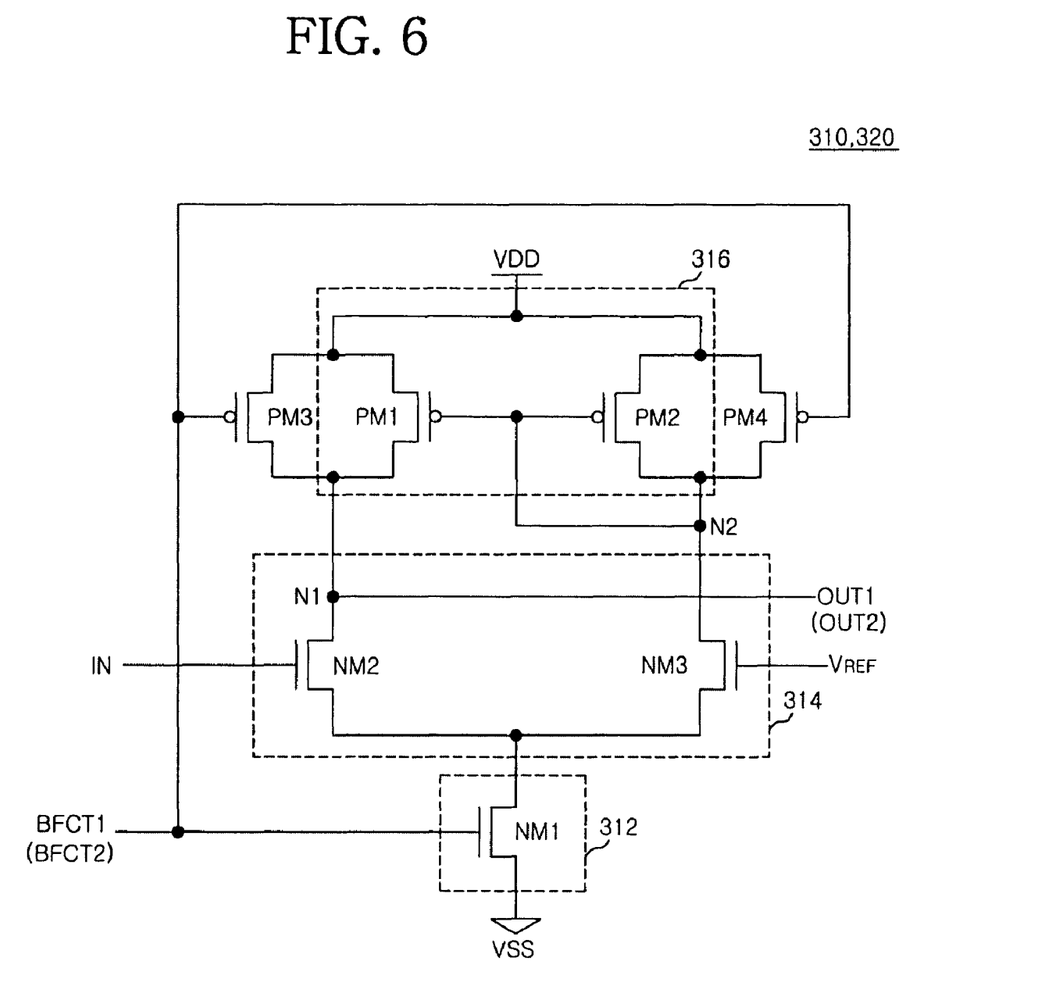
FIG. 6 is a circuit diagram illustrating the detailed structure of an input buffer unit according to an embodiment of the present invention.

FIG. 6 is a circuit diagram illustrating a differential-amplifier-type input buffer according to an embodiment of the present invention.

The first and second clock pin input buffers 310 and 320 are connected to the first and second clock pins (see reference numerals C1 and C2 in FIG. 1), respectively.

For convenience of explanation, in this embodiment, the differential-amplifier-type input buffer is given as an example, but the invention is not limited thereto. In addition, in the first and second clock pin input buffers 310 and 320, components having the same configuration are denoted by the same reference numerals.

The first and second clock pin input buffers 310 and 320 according to an embodiment of the invention each include an input buffer control unit 312, a differential input unit 314, and a current mirror unit 316.

The input buffer control unit 312 includes an NMOS gate NM1 that is controlled by the first or second input buffer control signal BFCT1 or BFCT2. The first or second input buffer control signal BFCT1 or BFCT2 is input to the NMOS gate NM1 to control the input buffer control unit 312. That is, when receiving the first or second input buffer control signal BFCT1 or BFCT2 in an active state, the corresponding input buffer 310 or 320 is activated. When receiving the first or second input buffer control signal BFCT1 or BFCT2 in an inactive state, the corresponding input buffer 310 or 320 is inactivated. The input buffer control unit 312 can be selectively controlled by the first and second input buffer control signals BFCT1 and BFCT2.

The differential input unit 314 compares a reference voltage $V_{REF}$ and an input voltage IN. In the differential input unit 314, an NMOS transistor NM2 to which the input voltage IN is applied and an NMOS transistor NM3 to which the reference voltage $V_{REF}$ is applied are connected to nodes N1 and N2, respectively, and are disposed opposite to each other.

The current mirror unit 316 is disposed between the differential input unit 314 and a power supply VDD, and mirrors a current.

The current mirror unit 316 includes first and second PMOS gates PM1 and PM2 each having a gate connected to the node N2. The first and second PMOS gates PM1 and PM2 have sources connected to the power supply VDD and drains connected to the drains of the NMOS gates NM2 and NM3, respectively. Transistors PM3 and PM4 are also provided.

Since the operation of the input buffers 310 and 320 is the same as that of a differential-amplifier-type input buffer, those who are skilled in the art can easily understand the operation of the input buffers 310 and 320, and thus a detailed description thereof will be omitted.

Similar to a general input buffer, when the input buffer control unit 312 is activated, the first and second clock pin input buffers 310 and 320 according to this embodiment each compare the input voltage IN with the reference voltage $V_{REF}$. The current mirror unit 316 mirrors a current that is determined by the difference between the two voltages to amplify the current, thereby supplying an output signal OUT.

According to this embodiment of the present invention, in the normal mode, the first input buffer control signal BFCT1 and the second input buffer control signal BFCT2 can be supplied as inverted signals, which makes it possible to selectively control the input buffers 310 and 320 connected to the corresponding pins. Therefore, the input buffers 310 and 320 are selectively activated, making it possible to prevent an increase in current consumption.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

As described above in detail, according to an embodiment of the invention, when it is not necessary to supply signals to some of the pins arranged symmetrically in a semiconductor package module, it is possible to selectively control input buffers connected to some of the pins. Therefore, when it is unnecessary to supply signals to the pins, it is possible to inactivate the input buffers and thus prevent an increase in current consumption.

What is claimed is:

1. A semiconductor integrated circuit comprising:
   a first pin controller that receives a mirror function signal and a test mode signal to generate a first input buffer control signal in a normal mode;

a second pin controller that receives the mirror function signal and the test mode signal to generate a second input buffer control signal, which is an opposite logic level of the first input buffer control signal, in the normal mode; and an input buffer unit that generates output signals for first and second pins in response to the first input buffer control signal and the second input buffer control signal, respectively.

2. The semiconductor integrated circuit of claim 1, wherein the first pin controller comprises:
a first mirror function controller that generates an inactive first mirror function control signal in response to an active mirror function signal; and
a first input buffer signal controller that receives the first mirror function control signal and the test mode signal to generate the first input buffer control signal.

3. The semiconductor integrated circuit of claim 1, wherein the second pin controller comprises:
a second mirror function controller that generates an active second mirror function control signal in response to an active mirror function signal; and
a second input buffer signal controller that receives the second mirror function control signal and the test mode signal to generate the second input buffer control signal.

4. The semiconductor integrated circuit of claim 3, wherein the second mirror function controller comprises an inverting unit that inverts the mirror function signal.

5. The semiconductor integrated circuit of claim 1, wherein the input buffer unit comprises:
a first pin input buffer that generates a first output signal in response to the first input buffer control signal; and
a second pin input buffer that generates a second output signal in response to the second input buffer control signal.

6. The semiconductor integrated circuit of claim 5, wherein the first pin input buffer and the second input buffer are exclusively controlled by the first and second input buffer control signals.

7. The semiconductor integrated circuit of claim 5, wherein an active first input buffer control signal activates the first pin input buffer.

8. The semiconductor integrated circuit of claim 5, wherein an active second input buffer control signal activates the second pin input buffer.

9. The semiconductor integrated circuit of claim 1, wherein both the first and second input buffer control signals are activated in response to an active test mode signal in a test mode.

10. A semiconductor integrated circuit comprising:
a first pin controller that receives a mirror function signal and a test mode signal to generate an inactive first input buffer control signal in response to an active mirror function signal in a normal mode;
a second pin controller that receives the mirror function signal and the test mode signal to generate an active second input buffer control signal, which is an inverted signal of the first input buffer control signal, in response to the active mirror function signal in the normal mode; and
an input buffer unit that generates output signals for first and second pins in the normal mode by driving an input buffer control unit that receives the first input buffer control signal and the second input buffer control signal.

11. The semiconductor integrated circuit of claim 10, wherein the first pin controller comprises:
a first mirror function controller that generates an inactive first mirror function control signal in response to the active mirror function signal; and
a first input buffer signal controller that receives the first mirror function control signal and the test mode signal to generate the first input buffer control signal.

12. The semiconductor integrated circuit of claim 10, wherein the second pin controller comprises:
a second mirror function controller that generates an active second mirror function control signal in response to the active mirror function signal; and
a second input buffer signal controller that receives the second mirror function control signal and the test mode signal to generate the second input buffer control signal.

13. The semiconductor integrated circuit of claim 12, wherein the second mirror function controller comprises an inverting unit that inverts the mirror function signal.

14. The semiconductor integrated circuit of claim 10, wherein the input buffer unit comprises:
a first pin input buffer that generates a first output signal in response to the first input buffer control signal; and
a second pin input buffer that generates a second output signal in response to the second input buffer control signal.

15. The semiconductor integrated circuit of claim 14, wherein the first pin input buffer and the second input buffer are exclusively controlled by the first and second input buffer control signals.

16. The semiconductor integrated circuit of claim 14, wherein an active first input buffer control signal activates the first pin input buffer.

17. The semiconductor integrated circuit of claim 14, wherein an active second input buffer control signal activates the second pin input buffer.

18. The semiconductor integrated circuit of claim 10, wherein both the first and second input buffer control signals are activated in response to an active test mode signal in a test mode.

19. The semiconductor integrated circuit of claim 10, wherein the input buffer unit comprises:
the input buffer control unit that receives the first or second input buffer control signals;
a differential input unit that is connected to one end of the input buffer control unit and that compares a reference voltage with an input signal; and
a current mirror unit that is disposed between the differential input unit and a power supply and mirrors a current.

20. A semiconductor package module comprising:
a substrate having a first surface and a second surface;
a first semiconductor integrated circuit that is mounted on the first surface of the substrate, and includes a first pin and a first pin controller that receives a mirror function signal to generate a first input buffer control signal in a normal mode; and
a second semiconductor integrated circuit that is mounted on the second surface of the substrate, and includes a second pin and a second pin controller that receives the mirror function signal to generate a second input buffer control signal, which is an opposite logic level of the first input buffer control signal, in the normal mode.

21. The semiconductor package module of claim 20, wherein the first pin controller is connected to the first pin of the first semiconductor integrated circuit, and the second pin controller is connected to the second pin of the second semiconductor integrated circuit.

22. The semiconductor package module of claim 21, wherein the first pin and the second pin are arranged in a mirror-type symmetric structure with respect to the substrate.

23. The semiconductor package module of claim 20, wherein the first pin controller comprises:
a first mirror function controller that generates an inactive first mirror function control signal in response to an active mirror function signal; and
a first input buffer signal controller that receives the first mirror function control signal and the test mode signal to generate the first input buffer control signal.

24. The semiconductor integrated circuit of claim 20, wherein the second pin controller comprises:
a second mirror function controller that generates an active second mirror function control signal in response to an inverted signal of the active mirror function signal; and
a second input buffer signal controller that receives the second mirror function control signal and the test mode signal to generate the second input buffer control signal.

25. The semiconductor integrated circuit of claim 20, wherein the first pin controller and the second pin controller are exclusively in the normal mode.

* * * * *